(12) United States Patent
Mitchell

(10) Patent No.: US 7,031,132 B1
(45) Date of Patent: Apr. 18, 2006

(54) SHORT CIRCUIT DIAGNOSTIC TOOL

(76) Inventor: Dennis A. Mitchell, 3526 Cameron Springs, San Antonio, TX (US) 78244

( * ) Notice: Subject to any disclaimer, the term of this patent is extended or adjusted under 35 U.S.C. 154(b) by 290 days.

(21) Appl. No.: 10/171,868

(22) Filed: Jun. 14, 2002

(51) Int. Cl.
*H02H 5/04* (2006.01)

(52) U.S. Cl. ........................ 361/103; 219/504; 324/525

(58) Field of Classification Search ............... 219/501, 219/212, 222, 505, 504; 361/106, 87, 24, 361/103, 104, 105; 337/401; 324/555, 556, 324/525

See application file for complete search history.

(56) References Cited

U.S. PATENT DOCUMENTS

| | | | |
|---|---|---|---|
| 3,152,259 A | | 10/1964 | Heine |
| 3,689,736 A | * | 9/1972 | Meyer ........................ 219/222 |
| RE28,656 E | * | 12/1975 | Crowley et al. ............. 219/212 |
| 4,023,136 A | | 5/1977 | Lamensdorf et al. |
| 4,074,335 A | * | 2/1978 | Takasugi ...................... 361/87 |
| 4,353,026 A | | 10/1982 | Edwards, Jr. |
| 4,371,910 A | | 2/1983 | Bube et al. |
| 4,408,244 A | * | 10/1983 | Weible ......................... 361/24 |
| 4,670,729 A | | 6/1987 | Oh |
| 4,682,140 A | | 7/1987 | Diaz-Noriega |
| 4,782,240 A | | 11/1988 | Davidson |
| 4,890,181 A | | 12/1989 | Nerowski et al. |
| 5,008,613 A | * | 4/1991 | Steinel et al. ............... 324/133 |
| 5,463,322 A | | 10/1995 | Kwasnick et al. |
| 5,476,497 A | | 12/1995 | Mower et al. |
| 5,543,705 A | | 8/1996 | Uezono et al. |
| 5,590,011 A | | 12/1996 | Hein |
| 5,606,483 A | | 2/1997 | Sawai et al. |
| 5,645,746 A | | 7/1997 | Walsh |
| 5,877,631 A | | 3/1999 | Takahashi |
| 6,075,689 A | | 6/2000 | Mitchell |
| 6,252,409 B1 | | 6/2001 | Iijima |
| 6,512,444 B1 | * | 1/2003 | Morris et al. ................ 337/401 |

FOREIGN PATENT DOCUMENTS

| | | | |
|---|---|---|---|
| DE | 2842859 | * | 4/1980 |
| DE | 19504092 | * | 8/1995 |
| DE | 29717260 | * | 11/1997 |
| JP | 09261842 | * | 10/1997 |
| JP | 02000197261 | * | 12/1998 |
| WO | WO 00/48012 | | 8/2000 |

* cited by examiner

*Primary Examiner*—Ehud Gartenberg
*Assistant Examiner*—Leonid Fastovsky
(74) *Attorney, Agent, or Firm*—Eric Cernyar

(57) ABSTRACT

A device and method for diagnosing shorts and fault conditions in electrical circuits such as heating, ventilation, and air conditioning (HVAC) control circuits. The device includes a positive temperature coefficient (PTC) member to protect the electrical circuit from overcurrent conditions during diagnosis. The device also includes a light emitting diode (LED) and resistor electrically connected in parallel across the PTC member. An overcurrent condition causes the resistance of the PTC member to rise dramatically, creating a potential difference across the PTC member and lighting the LED. The invention also includes a method for locating a short in an HVAC control circuit using the short locating device.

10 Claims, 5 Drawing Sheets

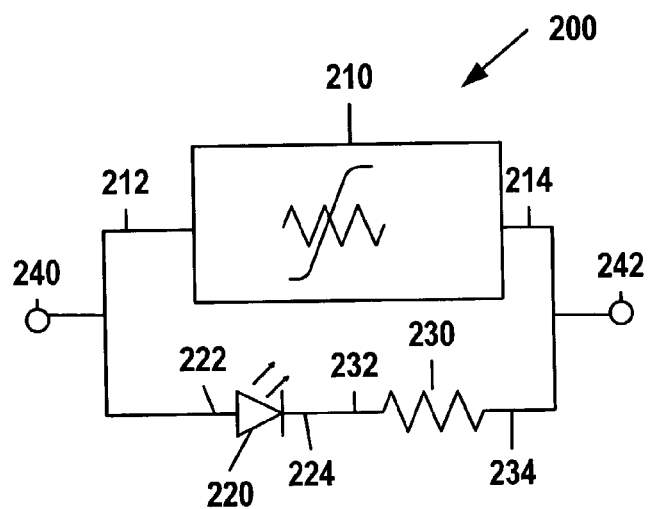
FIG. 2
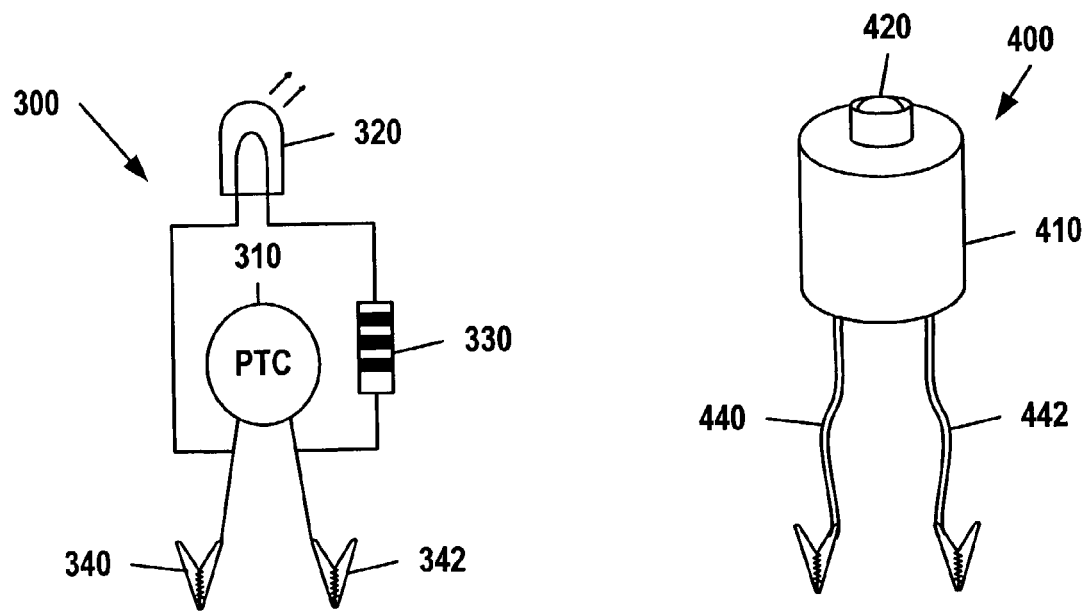
FIG. 3
FIG. 4

SHORT CIRCUIT DIAGNOSTIC TOOL

FIELD OF THE INVENTION

This invention relates generally to diagnostic tools for locating shorts and other fault conditions in electrical circuits, and in particular, to diagnostic tools for locating shorts while protecting the electrical circuits being diagnosed. More specifically, this invention relates to an electrical-circuit-protecting diagnostic tool for locating shorts or current fault conditions in heating, ventilation, and/or air conditioning (HVAC) control circuits.

BACKGROUND

One of the most common causes of electrical circuit or system failure is a short circuit. Shorts occur due to a variety of causes, including electrical component failure, damaged wiring, or damaged insulation. To restore the shorted electrical circuit to normal operation, the short must be located and the failed component, wiring, or insulation replaced. Precisely identifying the location and cause of a short circuit, however, is frequently a difficult and time-consuming task.

The challenge of locating shorts is one commonly faced by home appliance and HVAC service technicians. To verify the existence of a short, the service technician may replace a blown fuse with another fuse, or manually reset a tripped circuit breaker. However, if the short is drawing sufficient current, this will only result in another blown fuse or tripped circuit breaker, and the technician will not be aided in pinpointing the exact location of the short. In order to overcome these limitations, many service technicians jump the terminals of a blown fuse or tripped circuit breaker, and thereafter move wires around or probe different points in the local circuit in an effort to pinpoint the location of the short. Unfortunately, in the meantime, the appliance or HVAC transformer and other circuit components may overheat and become damaged.

Short locating tools are well known. For example, U.S. Pat. No. 4,353,026 to Edwards, Jr., discloses a short locating tool for high voltage applications utilizing two momentary push buttons, a relay circuit, and an audible horn that emits an audible alarm when a short is cleared. The short locating tool does not, however, include any short-circuit protection components to prevent current overloading. Rather, it provides a closed, essentially zero-resistance circuit between a power source and the shorted circuit's wire. While one can connect the diagnostic tool to one of the shorted circuit's own circuit breakers, if the short pulls enough current to trip the circuit breaker, the short locating tool is rendered useless.

Other short locating tools are described in U.S. Pat. No. 6,252,409 B1 to Iijima; U.S. Pat. No. 5,877,631 to Takahashi; U.S. Pat. No. 5,476,497 to Mower et al.; U.S. Pat. No. 5,463,322 to Kwasnick et al. These are all complicated and potentially expensive devices, require significant expertise to use, or have very specific applications.

What is needed is an inexpensive but reusable simple-to-use short locating tool that provides protection for the electrical circuit being diagnosed without requiring replacement of fuses or resetting of circuit breakers. This is particularly needed for home appliance and HVAC service technicians.

SUMMARY OF THE INVENTION

The invention is directed to, but not limited by, one or more of the following non-exhaustive objects, separately or in combination:

to provide a tool for diagnosing short circuits and over-current conditions;

to provide a short circuit diagnostic tool with automatically resettable overcurrent protection;

to provide a short circuit diagnostic tool with positive temperature coefficient (PTC) overcurrent protection;

to provide a short circuit diagnostic tool that is inexpensive and easy to use;

to provide a short circuit diagnostic tool for use in low-voltage circuits;

to provide a short circuit diagnostic tool designed, in use, to be temporarily mounted and moved from one branch circuit to the next;

to provide a short circuit diagnostic tool for use in circuits powered by a 24 volt, 60-Hertz power supply;

to provide a short-locating tool with PTC overcurrent protection that is amenable for use by technicians in servicing appliances and heating, ventilation, and/or air conditioning (HVAC) control circuits; and to provide a safe method of diagnosing a short circuit in a HVAC control circuit.

In U.S. Pat. No. 6,075,689, to Mitchell, I described a "Device and Method for Protection of Heating Ventilation and Air Conditioning Control Circuits from Overcurrents," the details of which are incorporated, in their entirety, by reference. In that patent, I described a device that included a polymeric PTC member for protecting HVAC control circuits that could be used as a substitute for a conventional fuse or circuit breaker.

A PTC device placed as a series element in a circuit protects the circuit by going from a low-resistance to a high-resistance value in response to an overcurrent. The distinguishing characteristic of a PTC device is that its resistance increases non-linearly as temperature increases, typically as a result of the material undergoing a phase change.

The PTC device, like any resistor, generates heat at a rate equal to the square of the current times power. In operation, the PTC device will reach a temperature of equilibrium where the heat is dissipated, by conduction or convection, as fast as it is generated.

At sufficiently low temperatures, corresponding to sufficiently low current levels, the resistance of the PTC device remains very low and increases at a very low rate with respect to temperature. In this stage, the resistance of the PTC device will generally be too low to have any significant influence on the operation of the circuit.

If, however, the current through the PTC device increases to a level, designated $I_{trip}$, sufficient to cause the temperature of the device to exceed a breakpoint (corresponding to a phase change in the PTC material, typically 125° C. in commercially available PTC devices), the resistance of the PTC device begins to rise very rapidly. At this stage, a very small temperature increase results in a very large increase in resistance. The large resistance increase, in turn, correspondingly decreases the current flowing through the circuit. In this manner, the circuit is protected from overcurrent conditions (such as short circuits).

In U.S. Pat. No. 6,075,689, I described my invention of an automatically resettable current protection device for use in HVAC control circuits as a substitute for a fuse or circuit breaker. Here, the invention I describe comprises a tool and method for using the same for diagnosing, detecting, and locating overcurrent conditions, including short circuits, in an electrical circuit. The tool comprises a light-emitting diode (LED) in series with a resistor and a PTC member in parallel with the LED-resistor pair. The tool also includes a pair of connective members, arranged so that the PTC member, LED, and resistor are disposed therebetween and in electrical contact therewith. The connective members provide the necessary external electrical interface for the diagnostic tool.

One of the advantages of my invention is that the PTC member rapidly resets itself when the overcurrent condition is removed. Moreover, unlike fuses, the PTC device is not destroyed by the overcurrent condition. And unlike circuit breakers, the PTC material-based device does not require a service technician using the device to manually reset anything. Another advantage of the present invention is the PTC member stays in a "tripped" state for an extended period of time, but resets itself quickly when the overcurrent condition is removed. This gives a service technician ample time to move wires and probe circuit points while attempting to locate a short.

In view of the need for reusable, non-bulky, short circuit diagnostic tool for a HVAC control circuit that includes overcurrent protection that can be reset without the user having access to the device, the present invention has been designed and developed. The present invention includes features and components that have been invented and selected for their individual and combined benefits and superior performance. The invention includes a circuit protection device for protecting an HVAC control circuits from overcurrents and methods for employing the circuit protection device.

These and other aspects, objects, features, and advantages of the present invention will be readily apparent to those skilled in the art from the following detailed description taken in conjunction with the annexed sheets of drawings, which illustrate the invention.

BRIEF DESCRIPTION OF THE DRAWINGS

FIG. 2 is a circuit diagram illustrating an alternative embodiment of the present invention configured to be used as a short locating tool.

FIG. 3 illustrates the electrical components of a preferred embodiment of the short locating tool of the present invention.

FIG. 4 is a perspective view of one embodiment of a short locating tool including a protective member at least partially covering the PTC member and connective members.

DETAILED DESCRIPTION

Based on the description and illustrations provided herein, the many benefits provided by the invented structure and methods of utilization are apparent. These described benefits, as well as those that are inherent to those skilled in the art, fall within the scope of the invention of the present patent application as limited only by the claims appended hereto.

Figure 1:
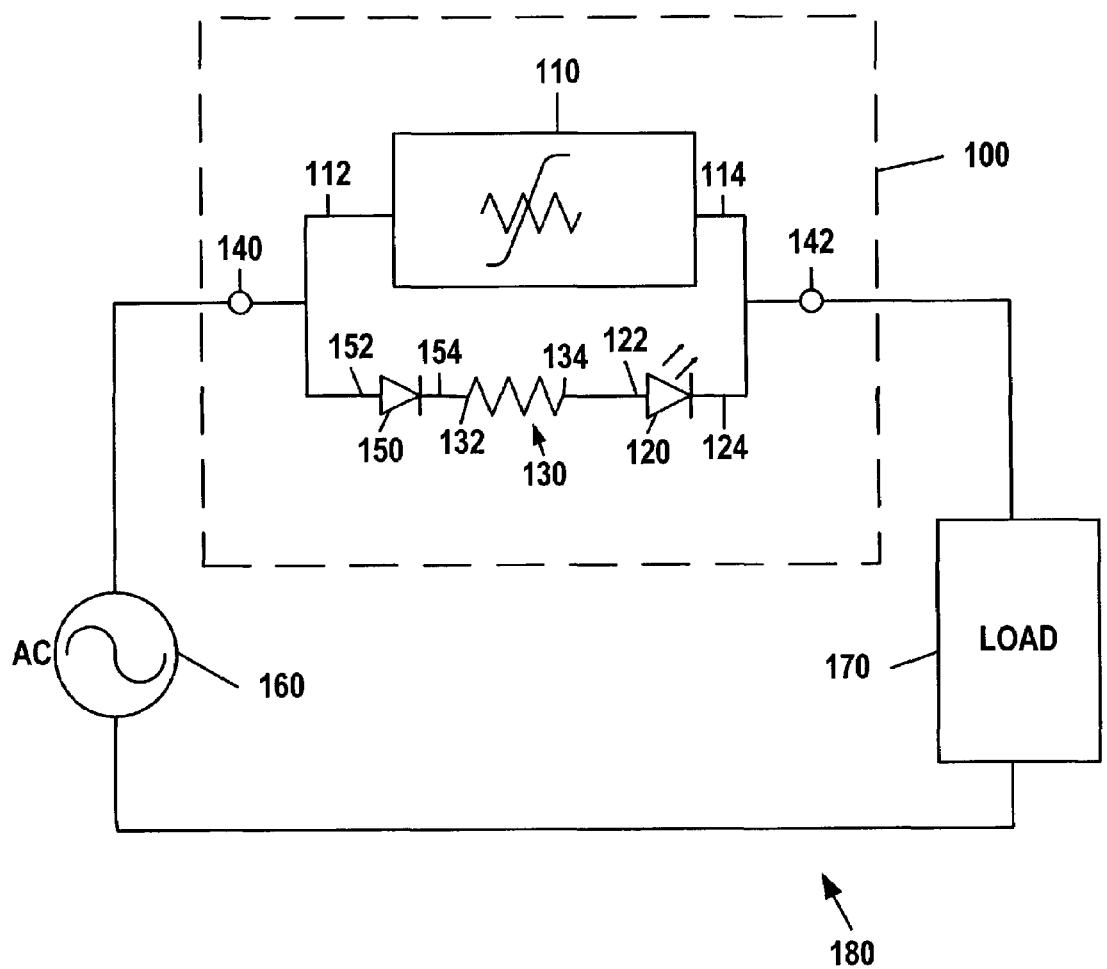
FIG. 1 is a circuit diagram illustrating one embodiment of the present invention configured to be used as a short locating tool for an electrical circuit, showing its placement within the electrical circuit.

Referring to FIGS. 1 and 2, each alternative embodiment of the short locating tool circuit 100, 200 comprises a PTC member 110, 210 having a first lead 112, 212 and a second lead 114, 214; a light emitting diode (LED) 120, 220 having an anode 122, 222 and a cathode 124, 224; and a resistor 130, 230 having a first lead 132, 232 and a second lead 134, 234. In each of these alternative embodiments, the resistor 130, 230 is electrically connected in series to the LED 120, 220, forming a resistor-LED pair; and the PTC member 110, 210 is electrically connected in parallel across the resistor-LED pair. In FIG. 1, the resistor 130 is electrically connected to the anode 122 of the LED 120. In FIG. 2, the resistor 230 is electrically connected to the cathode 224 of the LED 220. FIG. 1 also differs from FIG. 2 in that FIG. 1 depicts an optional additional diode 150 having an anode 152 and a cathode 154 that is electrically connected in series with lead 132 of resistor 130. Use of the additional diode 150 is believed to lengthen the performance life of the LED 120 when it is subjected to alternating currents.

FIG. 1 depicts the short locating tool circuit 100 in connection with the electrical circuit 180 being diagnosed. As depicted, electrical circuit 180 comprises an alternating current (AC) power source and load 170 in the electrical circuit. When the short locating tool circuit 100, 200 is used in a direct-current (DC) circuit, the lead 140, 240 should be connected to the current source side of a break in the DC circuit; and lead 142, 242 should be connected to the current drain side of the break in the DC circuit. In AC circuits, of course, leads 140, 240 and 142, 242 may be connected to either direction.

The LED 120, 220 is preferably a standard, low-cost, visible-light LED that is sufficiently bright to be easily detected in operation. To light a typical red LED, a voltage of at least about 1.7 volts must typically be applied across the LED's leads. Of course, other types and colors of LEDs, which typically require greater potential differences, may be used. The resistor 130, 230 preferably has a resistance sufficiently low, relative to the potential difference between leads 140, 240 and 142, 242, to allow enough current to pass through the LED 120, 220 at make the emitted light easily visible in typical maintenance environments. Typically, a desirable current will be in the vicinity of 7–10 mA. At the same time, the resistor 130, 230 preferably has a resistance sufficiently high, relative to the potential difference between the leads 140, 240 and 142, 242, to keep the flow-through current below the maximum rated current (typically, between 20 and 40 mA) of the LED 120, 220. For typical HVAC control circuits that are supplied by a 24 volt secondary voltage RMS, the preferred value of the resistor 130, 230 is between about 500 ohms and 3000 ohms, and more preferably, between about 1000 and 1500 ohms. One embodiment that I have created uses a standard low-cost, 10% tolerance, 1200 ohm, ¼ or ⅛ watt resistor. It will, of course, be appreciated that different values of resistors 130, 230 may be preferable when diagnosing significantly higher or lower voltage systems.

In connection with the overcurrent protection device I described in U.S. Pat. No. 6,075,689, I suggested that a PTC device be selected whose $I_{trip}$ characteristic (i.e., the current that will cause the material to "trip") is less than the maximum current carrying capacity, $I_{max}$, of an HVAC control circuit to be protected and greater than a combined load current, $I_{load}$, drawn by all loads in the HVAC control circuit when functioning properly; where $I_{max}$ is greater than $I_{load}$. This continues to be preferred, if possible. However, in the current state of the art, there is a significant ratio (e.g., ~2) between the maximum current at which the device will not trip (known as the hold current $I_{hold}$), and the minimum current at which the device will always trip (known as the trip current $I_{trip}$). In some HVAC circuits powered by a 24 volt, 40 VAC transformer, the ratio between $I_{max}$ and $I_{load}$ is smaller than the ratio between $I_{trip}$ and $I_{hold}$. In such cases it may be necessary to use a PTC device whose $I_{trip}$ is greater than the HVAC control circuit's $I_{max}$.

For example, a preferred embodiment of a short locating tool 100 for an HVAC control circuit utilizes a PTC member 110, 210 manufactured by Raychem® and designated as the RXE110 1.10A PolySwitch®, which, at the time of this writing, could be obtained in bulk at a cost of approximately $1.25 per PTC member. The RXE110's rated hold current $I_{hold}$ at 20° C. is 1.10 amps. The RXE110's rated trip current $I_{trip}$ at 20° C. is 2.20 amps. The RXE110's rated maximum time to trip at currents six (6) times the hold current $I_{hold}$, is 8.2 seconds. As will be understood by those familiar with PTC devices, the time-to-trip is significantly lower for higher trip currents. While tripped, the RXE110 is rated to dissipate approximately 1.5 watts of power at 20° C. in a still air environment. The RXE110's rated initial resistance, prior to ever being tripped, is between 0.15 and 0.25 ohms. The RXE110's rated post-trip resistance (i.e., the maximum resistance to which the RXE110 will return one hour after the over-current condition is removed) is 0.38 ohms. The RXE110 is also rated to operate at a maximum voltage of 60 volts and a maximum current of 40 amps.

Notably, the RXE110 has a maximum rated voltage that is well below the typical voltage (120V) supplying most HVAC transformers. If there is a short from the 120 volt power supply across the transformer, the RXE110 may detect this unusual occurrence by being destroyed by the overvoltage condition. This has the important advantage of alerting the technician of an unusual and potentially dangerous condition and saving the technician time that might otherwise be wasted attempting to isolate the problem in some other part of the HVAC circuit.

In operation, the PTC member 110, 210 will provide a path of very low resistance (less than one to three ohms) if no overcurrent condition exists. In a properly functioning HVAC branch circuit, this resistance should be far less than the load impedance, resulting in a negligible voltage drop between lead 140, 240 and lead 142, 242. This, in turn, limits the current flowing through LED 120, 220, as well as the voltage drop across LED 120, 220, thus preventing it from becoming lit. On the other hand, the existence of a short will cause the PTC member 110, 210 to heat up, and in turn increase the PTC member's resistance, resulting in a large voltage drop between lead 140, 240 and lead 142, 242. This, in turn, increases the current flowing through LED 120, 220, as well as the voltage drop across LED 120, 220, to levels sufficient to light it. In this manner, the short locating tool of the present invention both signals the technician to the existence, if any, of a short while simultaneously protecting the circuit and transformer from excessive current.

There are, of course, many possible adaptations of the short locating tool circuit 100, 200. For example, other signaling apparatuses, such as regular visible light bulbs, buzzers, electromagnetic signal transmitters (digital or analog), or any of the foregoing in combination with a secondary signal-transmitting circuit, may be used in place of LED 120, the LED-resistor pair, or in place of all three of the series-connected LED 120, resistor 130 and diode 150. Of course, with any of these alternative signaling apparatuses, different values of resistor 130 (if used) may be required in order to permit sufficient current to activate the signaling device when a fault is detected. Nevertheless, the preferred mode of the invention utilizes an LED-resistor pair because LEDs are less expensive and/or require less current than most alternative signaling apparatuses.

In a yet further alternative embodiment (not shown), a second resistor-LED pair, with the anode and cathode of the second LED oriented opposite the LED of the first resistor-LED pair, is connected in parallel with the PTC member, so that one of the LEDs will light up to signal an overcurrent condition regardless of the direction in which the leads 140, 142 and 240, 242 are connected in a DC circuit.

It will also be appreciated that for AC circuit applications, other impedance members, such as capacitors and inductors, may be substituted for or used in combination with the resistor 130, 230 to limit the current flowing through the LED 120, 220. It will also be appreciated that a bridge rectifier could be combined with the circuit 100, 200.

It should be understood that any of the aforementioned adaptations, whether or not directly illustrated in the drawings, are within the scope of the invention and may be encompassed within the scope of one or more of the claims.

FIG. 3 provides a physical illustration of the electrical components of a preferred embodiment of a short locating tool 300. The short locating tool 300 comprises a radially leaded PTC member 310 disposed electrically between a pair of connective members 340 and 342. The short locating tool 300 also comprises a LED 320 with a pair of leads, one of which is electrically connected to connective member 340, the other of which is electrically connected in series with a resistor 330. The resistor 330 is electrically connected to connective member 342. Connective members 340 and 342 may comprise clamps such as alligator clips.

FIG. 4 provides a perspective view of one embodiment of a short locating tool 400 including a protective member 410 at least partially covering a PTC member and resistor (neither of which are shown) and connective members 440 and 442. The LED 420 protrudes from the top of the protective member 410. The protective member 410 comprises insulating material such as rubber or molded plastic and serves to protect a user from contact with electrical hazard when the tool 400 is installed and to protect the device 400 from electrical and mechanical hazard.

Figure 5:
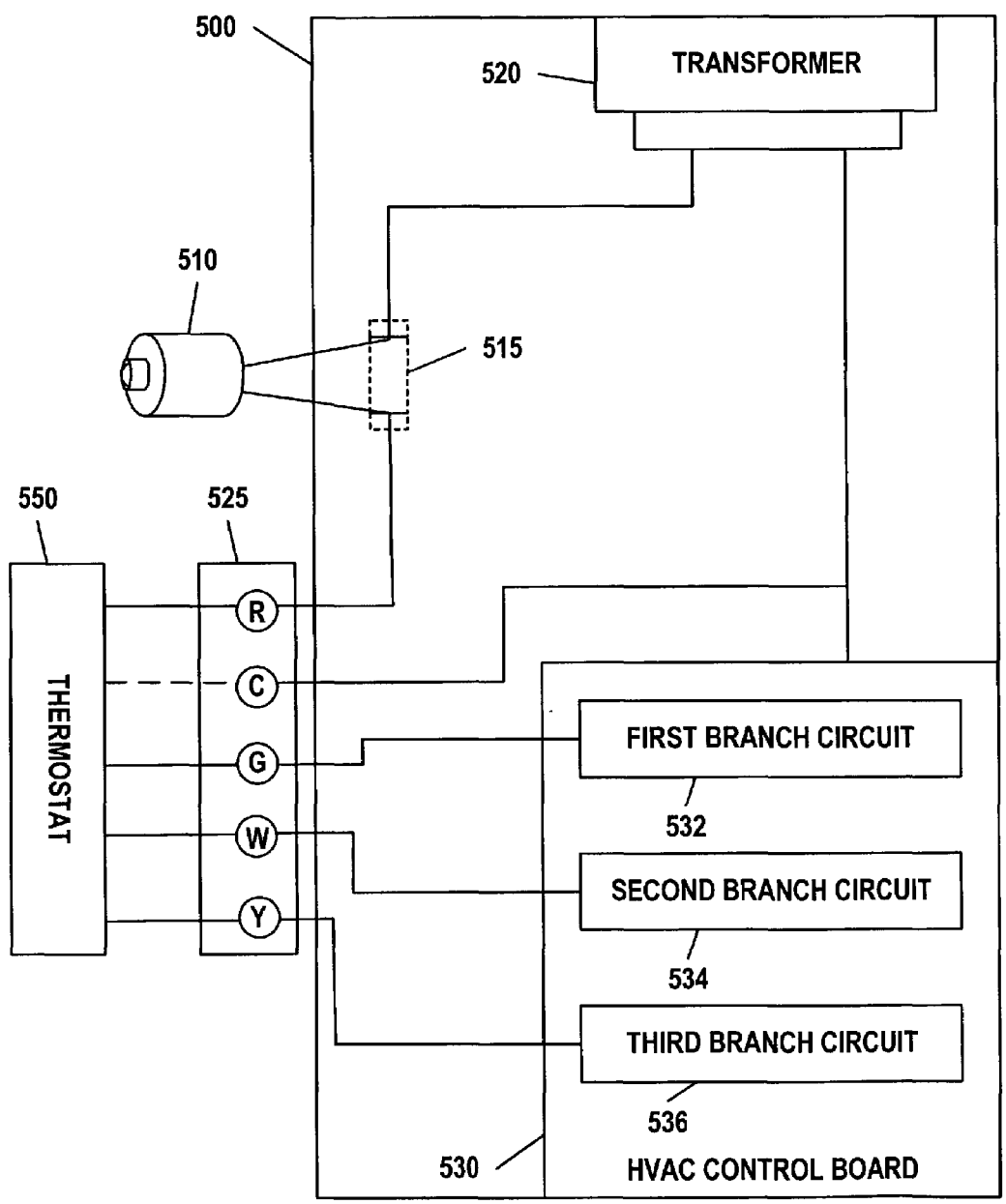
FIG. 5 is a simplified illustration of a HVAC control circuit, depicting a short locating tool connected across the terminals of a fuse holder.

FIG. 5 is a simplified illustration of a HVAC electrical circuit 500, depicting a short locating tool 510 of the present invention connected across the terminals of an overcurrent protection receptacle 515. The HVAC electrical circuit 500 illustratively comprises a 40 volt-amp transformer 520 having a 24 volt secondary voltage; a standard HVAC terminal bus 525 having terminal connections for power (R), common ground (C), the fan circuit (G), the heating circuit (W), and the compressor circuit (Y); a thermostat 550; an overcurrent protection receptacle 515 (illustratively comprising a fuse holder and/or a fuse); and a HVAC control board 530. The HVAC control board 530 comprises a plurality of branch circuits 532, 534, and 536. By way of illustration, the first branch circuit 532 may comprise a fan control circuit, the second branch circuit 534 may comprise a heating control circuit, and the third branch circuit 536 may comprise a cooling control circuit that increases the fan speed.

Figure 6:
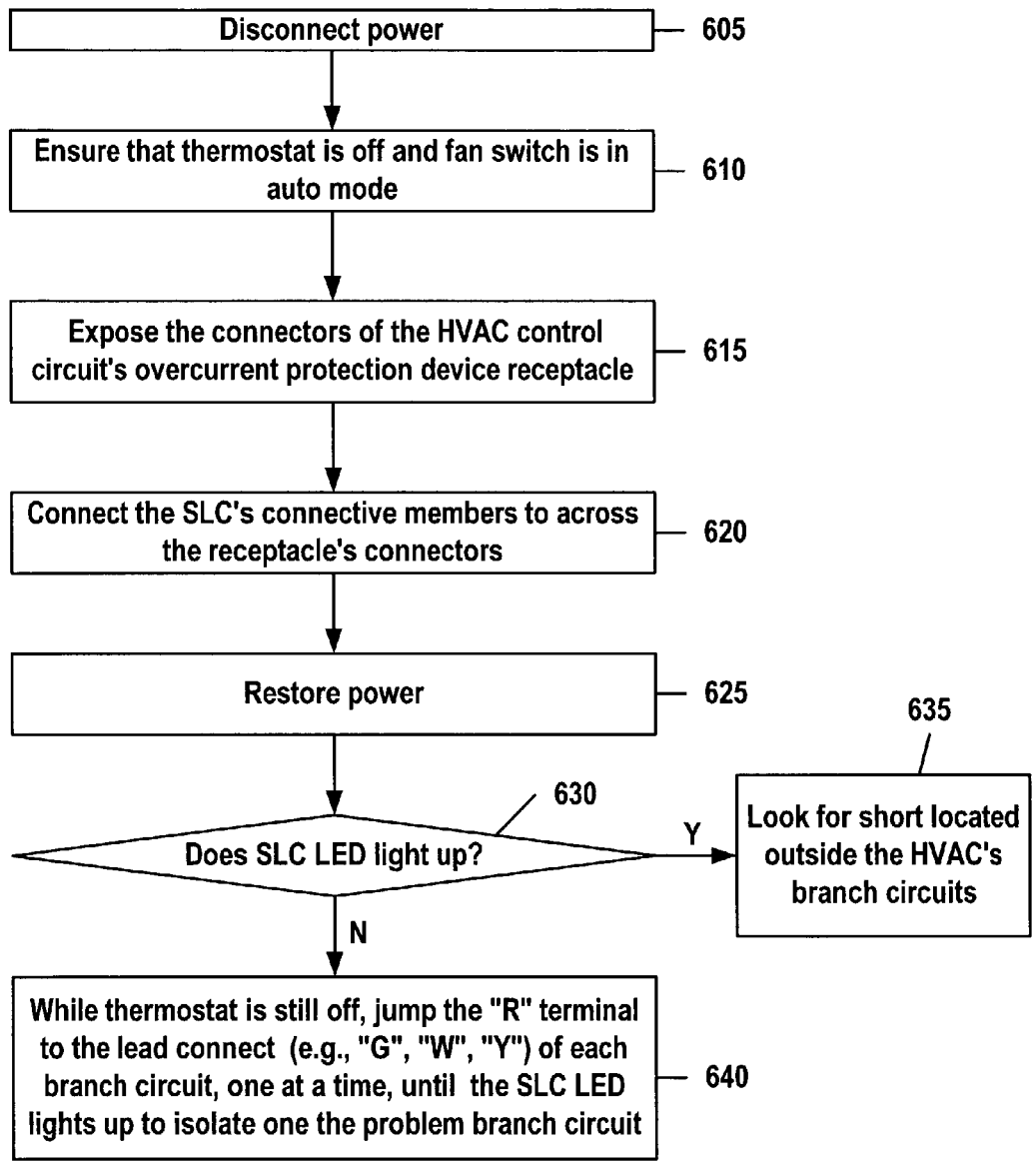
FIG. 6 illustrates a method of locating a short in a HVAC control circuit using a short locating tool built in accordance with the present invention.

FIG. 6 illustrates a method of isolating a fault condition in a HVAC control circuit using a short locating tool built in accordance with the present invention. As illustrated in block 605, power to the control circuit is disabled or disconnected. Also, as depicted in block 610, the technician ensures that the thermostat is off and the fan switch is in the auto mode. In block 615, the terminals or connectors of the control circuit's receptacle (e.g., fuse holder) for its overcurrent protection device (e.g., fuse) are exposed (e.g., if the device is a fuse, by removing it). In block 620, the connective members of the short locating tool are connected in series across the terminals or connectors of the circuit's overcurrent protection device or receptacle/holder. In block 625, power to the control circuit is restored. In block 630, the technician looks at the LED on the short locating tool to learn whether it is signaling a fault condition. If the LED lights up, this indicates, as depicted in block 635, that a short is located outside the HVAC's branch circuits. The short, for example, may be located between one of the wires going to the thermostat and ground.

If the LED did not light up, then, as depicted in block 640, the technician jumps the power terminal (depicted as "R" in FIG. 5) to the lead connect (depicted as "G," "W," and "Y") of each branch circuit, one at a time, until the LED lights up. If the LED lights up, the particular branch circuit being jumped is the problem circuit.

It will be understood that the actions depicted in FIG. 6 do not have to be done in the order depicted. For example, the order of blocks 605 and 610 are interchangeable. Additional actions, not depicted, may also be desirable. For example, if there is a time delay circuit or relay in the condensing unit or in a cooling circuit, the technician may want to use a jumper to electrically bypass the time delay circuit or relay while searching for the short. This is because a short condition is likely to trigger the time delay and interfere with or delay the circuit's diagnosis.

One advantage of the methods described above is that they allow the technician to very quickly isolate a short to one of four problem areas. Another advantage of this method is that the technician can leave the short locating tool in the HVAC control circuit while testing wires and circuit components at or near the condensing unit, without fear of having a short circuit damage or destroy the HVAC circuit.

Figure 7:
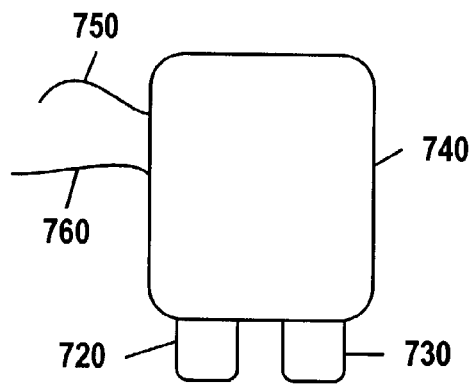
FIG. 7 is a front elevational view of the connective members of one embodiment of the short locating tool.
Figure 8:
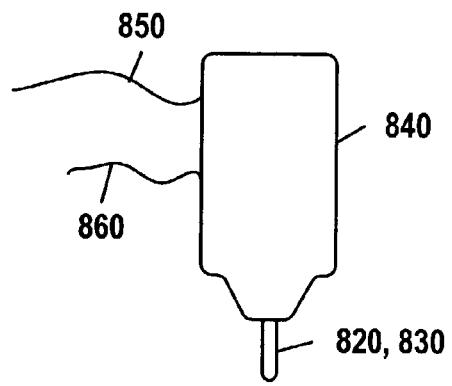
FIG. 8 is a side elevational view of the connective members depicted in FIG. 7.
Figure 9:
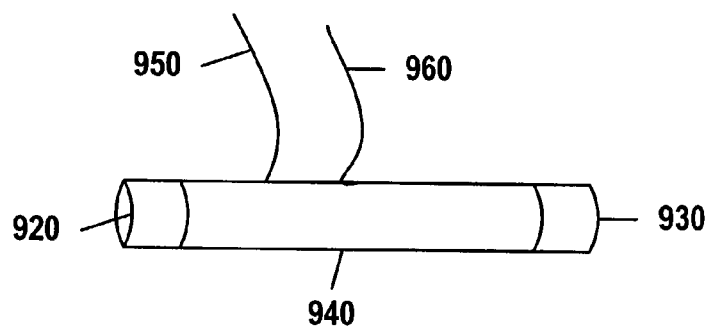
FIG. 9 is a perspective view of the connective members of another embodiment of the short locating tool.

Finally, FIGS. 7–9 depict various alternative configurations for the connective members 440, 442 of the short locating tool. While in FIG. 4 the connective members were depicted as spring-biased clamps, different physical configurations for the connective members may be preferable in some situations. FIGS. 7 and 8 depict connective members 720, 730, 820, 830 disposed within a housing 740, 840 and configured as a pair of parallel coplanar blades electrically and mechanically compatible with a blade-type fuse receptacle. FIG. 9 depicts connective members 920, 930 separated by fuse-shaped member 940, wherein the connective members 920, 930 are electrically and mechanically compatible with a cartridge-type fuse and configured to be temporarily inserted into a cartridge-type fuse receptacle. In each of these embodiments, the connective members 720, 730, 820, 830, 920, 930 are electrically connected to leads 750, 760, 850, 860, 950, 960 of the PTC member (not shown) of the short locating tool.

Although the foregoing specific details describe various embodiments of the invention, persons reasonably skilled in the art will recognize that various changes may be made in the details of the method and apparatus of this invention without departing from the spirit and scope of the invention as defined in the appended claims. Therefore, it should be understood that, unless otherwise specified, this invention is not to be limited to the specific details shown and described herein.

Furthermore, it should be appreciated that continuation, divisional, and continuation-in-part applications from this specification may be pending at the time this patent issues, the claims of which may encompass embodiments and applications that are broader than the appended claims. Accordingly, if there are any embodiments disclosed in the specification that are not literally claimed in the appended claims, such embodiments or elements should not be presumed to be dedicated to the public.

I claim:

1. A diagnostic tool for detecting the presence of an electrical short in an electrical circuit having a voltage supply with a maximum output voltage, the tool comprising:
    a positive temperature coefficient (PTC) member that protects the electrical circuit being diagnosed from excessive current, the PTC member being characterized in that:
        the PTC member is in a relatively low resistance state when current flowing through the PTC member is substantially less than a trip current value;
        the PTC member's resistance increases nonlinearly to a relatively high resistance state when current flowing through the PTC member exceeds the trip current value; and
        the PTC member has two electrical leads;
        the PTC member is adapted to be damaged by an overvoltage condition of 120 volts;
    a signaling apparatus having two electrical leads electrically connected in parallel with the two electrical leads of the PTC member, wherein the signaling apparatus emits a signal only when the PTC member is in a relatively high resistance state; and
    two electrically conducting spring-biased clamps electrically connected to the electrical leads of the PTC member for temporarily connecting the diagnostic tool to the electrical circuit.

2. The diagnostic tool of claim 1, wherein the signaling apparatus comprises an impedance device electrically connected in series with a light emitting diode (LED), the impedance device being adapted to limit the current flowing through the LED to a level below a maximum rated current for the LED when the signaling apparatus is subjected to the maximum output voltage of the voltage supply.

3. The diagnostic tool of claim 2, wherein the impedance device comprises a resistor.

4. The diagnostic tool of claim 3, wherein the signaling apparatus further comprises an additional diode electrically connected in series with the resistor and the LED.

5. The diagnostic tool of claim 1, wherein the PTC member comprises a polymeric material that, when heated to a sufficiently high temperature, undergoes a phase change between a first substantially conductive state and a second substantially non-conductive state.

6. The diagnostic tool of claim 1,
    wherein the PTC member comprises a polymeric material that, when heated to a sufficiently high temperature, undergoes a phase change between a first substantially conductive state and a second substantially non-conductive state, and
    wherein the signaling apparatus comprises a resistor electrically connected in series with a light emitting diode (LED), the resistor being adapted to limit the current flowing through the LED to a level below a maximum rated current for the LED when the signaling apparatus is subjected to the maximum output voltage of the voltage supply.

7. A diagnostic tool for detecting the presence of an overcurrent condition in an air conditioning control circuit, the tool comprising:

impedance means for protecting the electrical circuit being diagnosed from excessive current, the impedance means being characterized in that:

the impedance means is in a relatively low impedance state when current flowing through the impedance means is substantially less than a trip current value;

the impedance means' impedance increases nonlinearly to a relatively high impedance state when current flowing through the impedance means exceeds the trip current value; and the impedance means is adapted to be damaged by an overvoltage condition of 120 volts; and signaling means electrically connected to the impedance means for signaling the presence of an overcurrent condition.

8. The diagnostic tool of claim 7, wherein the signaling means is electrically connected in parallel with the impedance means.

9. The diagnostic tool of claim 7, wherein the signaling means comprises at least one light-emitting diode in series with a resistor.

10. The diagnostic tool of claim 7, further comprising electrically conductive connecting means for connecting the diagnostic tool to the air conditioning control circuit.

* * * * *